United States Patent [19]

Kinsley, Jr.

[11] Patent Number: 4,948,463
[45] Date of Patent: Aug. 14, 1990

[54] MAGNETIC BARRIER PAPER

[75] Inventor: Homan B. Kinsley, Jr., Powhatan, Va.

[73] Assignee: James River Corporation, Richmond, Va.

[21] Appl. No.: 321,313

[22] Filed: Mar. 10, 1989

[51] Int. Cl.⁵ ............................................. D21H 13/36
[52] U.S. Cl. ................................. 162/138; 162/181.1; 206/444; 428/900
[58] Field of Search ............................ 162/138, 181.1; 428/900; 206/328, 444, 524.4

[56] References Cited

U.S. PATENT DOCUMENTS 1,514,406 11/1924 Taylor .............................. 162/181.9
2,400,544 5/1946 Kline et al. ....................... 162/138
4,234,378 11/1980 Iwasaki et al. ..................... 162/138
4,774,272 9/1988 Camphere et al. ................. 162/162

FOREIGN PATENT DOCUMENTS 561761 6/1977 U.S.S.R. ............................. 162/181.9

Primary Examiner—Karen M. Hastings
Attorney, Agent, or Firm—Burns, Doane, Swecker & Mathis

[57] ABSTRACT

Provided by the present invention is a novel magnetic barrier paper comprised of low hysteresis iron powder. Preferably, the iron powder employed has a hysteresis value of not more than about 5 parts per thousand. The magnetic barrier paper of the present invention is particularly applicable to the protection of floppy disks, as well as electronic components, from stray magnetic fields.

9 Claims, No Drawings

MAGNETIC BARRIER PAPER

BACKGROUND OF THE INVENTION

The present invention relates to a magnetic barrier paper useful for protecting magnetic disks and various electronic components from the deleterious effects of stray magnetic fields.

As the use of electronics has become more widespread, and systems incorporating electronics have become more sophisticated, a phenomenon known as electronic magnetic interference ("EMI") has become a major problem to the use of such electronic systems. EMI is an electrical phenomenon that causes an undesired result at a receiving device. It is generated most often by man-made electrical components but can also be generated from natural sources such as lightning or simple triboelectric discharges. EMI can be manifested as interference that is conducted into or out of electronic equipment, or as interference that is radiated into or out of the circuitry thereof.

The effect of EMI can be as serious as a "shut down" of a computer because of memory loss. In its less serious aspects, EMI can result in phenomena such as the annoying hum heard on poorly designed stereo systems. The FCC is enforcing regulations on equipment that generates EMI signals at higher frequencies (FCC part 15, docket 20780, for example). Some of the more common systems which contribute to or are affected by EMI are power switching supplies, electronic games, electronic watches, calculators, microwave ovens, computers (both personal and industrial), stereos, televisions, and electronic components.

Stray magnetic fields are particularly injurious to an article finding increasingly widespread use, namely, the conventional 5" floppy disk for computers. This disk stores information on its surface by having a magnetic code imprinted in the coating formed thereon. Stray magnetic fields can erase or destroy the information encoded in this coating, resulting in an irretrievable loss of work product.

Conventional magnetic record disk assemblies comprise an outer jacket permanently encasing the disk itself. The jacket has a central opening aligned with the opening in the disk, to permit access by a drive mandrel in the disk drive unit. The jacket also has a radially extending oblong opening for receiving a reading and writing head of the data processing unit. U.S. Pat. No. 4,038,693 in the name of Huffine et al discloses such a disk assembly in which the jacket is formed from an antistatic material. This prevents static electricity from accumulating on the jacket during handling, and thus prevents extraneous signals from being sent to the transducer associated with the reading and writing head. The jacket comprises an outer layer of electrically insulating material and an inner layer of an electrically conductive material, provided for the purpose of draining away any electrostatic charge which accumulates on the outer layer.

It is also known to produce paper having magnetic properties. U.S. Pat. No. 4,234,378 to Iwasaki et al teaches such a paper, containing 70-90 parts by weight magnetoplumbite barium ferrite powder and/or magnetoplumbite strontium ferrite powder, the particles of which have a primary particle size of about 0.1-2 microns and a secondary particle size smaller than about 20 microns, 1-10 parts by weight anionic synthetic latex and/or synthetic resin, about 2-10 weight percent cationic organic polymer electrolyte and more than about 5 parts by weight pulp fibers. The sheet is formed by conventional paper making techniques, and is thereafter magnetized.

SUMMARY OF THE INVENTION

It has now been discovered that floppy disks, as well as other electronic components, can be effectively protected from stray magnetic fields by enclosing them in a new magnetic barrier paper. The magnetic barrier paper according to the present invention contains from 30-94% by weight iron powder, 3-67% by weight pulp fiber, and 3-10% by weight latex. It has been found that such a magnetic paper will effectively protect articles enclosed thereby, due to its ability to confine stray magnetic fields by conducting them within the magnetic structure of the paper, without permitting such fields to reach the enclosed article at sufficient strength to damage the article. The ability of the paper to conduct stray magnetic fields within its structure means that the paper need not completely envelop the article to provide sufficient protection. If the article is substantially enclosed within the paper, the paper will tend to divert stray magnetic fields away from any minor exposed portions.

To achieve the above results, it is also important that the iron powder used in the above formulation be a low hysteresis iron powder. It has been found that by using low hysteresis iron powder in the above formulation, the resulting paper will effectively dissipate stray magnetic field without itself becoming permanently magnetized. This is an important consideration for ensuring the prolonged useful life of the paper, and for preventing the paper from itself interfering with the reading and writing components of a data processing apparatus.

The magnetic barrier paper according to the present invention thus functions in the same manner as a "keeper" on a magnet, and concentrates therein the lines of magnetic field that might otherwise reach and damage the enclosed article.

DETAILED DESCRIPTION

As noted above, the three principal ingredients of the magnetic barrier paper according to the present invention are pulp, latex and iron powder. Any conventional paper-making pulp is suitable for use in the present invention, and especially preferred are cellulosic pulps from deciduous and coniferous trees, cotton and waste paper. Inorganic pulps are also suitable for use in the present invention, such as those based on asbestos and the like. Synthetic fibers such as polyethylene may also be used.

Similarly, a variety of latexes are suitable for use in the present invention. Essentially, the nature of the pulp and latex used must be such that, within the weight percent ranges recited above, they are sufficient to hold the composition together in paper form. Among the commercially available latexes which are envisioned as being particularly useful in the practice of the present invention are the anionic acrylonitrile copolymers, e.g., those available from B. F. Goodrich under the trademarks Hycar 1561 and Hycar 1562, and the anionic acrylic polymers, e.g., those available from B. F. Goodrich under the trademarks 2600 X84 and 2600 X106. Other conventional latexes may also be appropriate.

In general, the latex can be mixed with the paper pulp slurry prior to making paper. After the addition, the latex can be precipitated or fixed to the fiber by adding alum (aluminum sulfate) to the system. The alum is generally added until a certain pH value is achieved, e.g., 4.5. The more alum added, the greater the reduction in pH.

It is the iron powder, however, whose character is most essential to forming a suitable paper according to the present invention. As discussed above, the iron powder should be present in a weight percent ranging from 30–94% and further should be a low hysteresis powder. By low hysteresis it is meant that paper according to the invention incorporating such a powder will respond in a substantially reversible manner to an applied magnetic field. When the magnetic field is removed, the amount of magnetic induction field induced in the paper will return to its initial state, without the paper being permanently magnetized to any appreciable degree. If a low hysteresis iron powder is not used, the paper would tend to become permanently magnetized and thus would be an entirely different type of product, more like that disclosed in the Iwasaki et al patent discussed above. If the paper is permanently magnetized, it will by definition store a magnetic field. If the paper were to become permanently magnetized, it would erase or distort the magnetic information on the disk, which it was designed to protect, every time that it passed close to the disk. Thus, the use of a high magnetic hysteresis powder such as the barium ferrite powder of Iwasaki et al would render the paper more damaging than helpful.

Iron powders suitable for use in the present invention are marketed by GAF Corporation, which describes them as "Carbonyl Iron Powders". The term "Carbonyl" in that designation does not refer to the composition of the powder, as they are substantially pure iron, but rather to the particular process by which the powders are made.

The iron powders suitable for use in the present invention, preferably have a hysteresis value of not more than about 5 parts per thousand, and most preferably less than about 1 part per thousand. This means that when one makes a plot of magnetic induction (B) versus field strength (H) on a chart of one square meter for the iron powders used in the present invention, the extent of hysteresis as appears on that plot is not more than about 5 mm and preferably less than 1 mm.

The iron powders used in the present invention have an average particle diameter ranging from about 2 to about 9 microns. It is believed that the particle size of the iron powders used in the present invention has an important bearing on the low hysteresis value discussed above. Specifically, the current theory of ferromagnetism postulates the existence of so-called "domains" within a ferromagnetic specimen. These domains are local regions within which there is essentially perfect alignment of atomic dipoles. In the absence of an applied magnetic field, however, the domains are randomly oriented relative to one another, and thus no magnetic induction (B) can be detected from the sample as a whole. When the iron is magnetized by placing it in an external magnetic field, it is believed that the domains that are favorably oriented increase in size at the expense of those that are not. Hysteresis, according to this theory, is the extent to which the domain boundaries fail to resume their original positions when the external field is removed.

It has accordingly been theorized that the larger the particle size, the more domains will be present within a given particle. In turn, the more domains within a particle, the less hysteresis will be observed because a relatively lesser amount of the domains will be confined by the crystal structure of the particle. From the above discussion, it will be seen that whereas the average particle diameter of the iron powder suitable for use in the present invention ranges from about 2 to about 9 microns, there should be no more than an insignificant amount of iron powder below the 2 micron size.

On the other hand, as the particles increase in size, they tend less readily to flocculate each other and thus be less uniformly fixed onto the pulp. It is accordingly especially preferred that the iron powders used in the present invention have an average particle size ranging from about 2 to about 6 microns.

EXPERIMENTAL DATA

A series of hand sheets according to the invention was made using B/G softwood raft pulp, Goodrich 2671 latex (i.e., a cross-linkable acrylic latex) and several types of GAF carbonyl iron powders, namely types TH, W and E. The amounts of the various ingredients used are set forth in the following Table 1.

First, the pulp was added to a Waring blender in the specified amounts. This mixture was mixed at medium speed for 2 minutes. Thereafter, the latex was added and the resultant combination was blended until thoroughly mixed. The iron powder was then added and thoroughly mixed into the combination. Thereafter, alum solution was added and mixed briefly to coagulate the latex. Hand sheets were then formed by adding the fiber furnished to a conventional hand sheet mold, and then diluting the slurry until the mold was half filled (i.e., four liter level). It has been found that the retention of the iron powder is improved if dilution is to only the four liter level (half the mold). The hand sheets were then pressed between blotters to remove water. They were dried on a hot curved surface dryer. The hand sheets thus prepared had the following composition:

TABLE 1

| Sample No. | GAF Powder Code | Iron Powder (g) | Pulp (g) | Latex (g) | Calculated Basis Wt., lb/3,000 Ft.$^2$ | Actual Basis Wt., lb/3,000 Ft.$^2$ |
|---|---|---|---|---|---|---|
| 1 | TH | 80.6 | 4.0 | 5.0 | 1334 | 1252 |
| 2 | W | 80.3 | 4.0 | 5.0 | 1329 | 1257 |
| 3 | E | 79.5 | 4.0 | 5.0 | 1316 | 1263 |

The hand sheets thus prepared were then tested for their ability to confine magnetic fields. First, the hand sheets were tested using a 115V, 60 cycle Varax in conjunction with a test coil in circuit with a DC milliamp meter. The test coil was made of No. 22 copper wire. It had 27 turns per layer and 17 layers of wire. The exterior diameter of the coil was 1.25 inches and its interior diameter was 0.375 inches. The Varax was adjusted to give a full scale reading on the milliamp meter. The hand sheets thus prepared were then placed on top of the relay coil, such that the magnetic lines would pass through the paper and reduce the field at the test coil.

The amount of reduction was expressed as a percent decrease in the original field strength. The sheets thus prepared reduced the field about 5% at the test coil. For comparison, an iron plate having an equivalent basis weight of 4500 lb/3,000 Ft.$^2$ was tested and it was found that this iron plate reduced the field about 30% at the test coil. As all of the hand sheets according to the invention reduced the field about the same, further tests were performed on sample No. 3 containing the type E iron powder, since this was the least expensive.

The type E hand sheets were then tested on a model 902 Gauss Meter produced by RFL Industries, Incorporated. First, the probe of the Gauss Meter was placed in a TYVEC envelope for floppy disks. (TYVEC is a trademark of the Dupont company, used for floppy diskettes). Then, a small rod magnet was brought in contact with the outer surface of the envelope This resulted in a reading of 590 Gauss. Next, a sheet according to sample No. 3 of the present invention was placed over the envelope, and the magnet was placed in contact with that sheet. The maximum reading on the Gauss Meter was then 388 Gauss.

Comparative testing was then performed, using the above Gauss Meter, a small horse shoe magnet, 0.0005 inch thick tin plated iron foil received from Barrington (#64-95 Code 8), a "keeper" in the form of a 3/16"×½"×1 9/16" soft iron bar supplied with the magnet, and 20lb/RM Black Twisting Stock (KVP Exp 96162), and the sheets according to Example 3 of the present invention. A series of readings were taken from the Gauss Meter at various spacings between the magnet and the probe, first with nothing between the magnet and probe, then with the test material either in adjacent contact with the magnet or adjacent with the probe. The results of these measurements, expressed in units of Gauss, are set forth below in Table 2.

TABLE 2

| | Material Tested | | | | |
|---|---|---|---|---|---|
| | Nothing | Keeper (Heavy Iron) | Present Invention (Sample 3) | Foil | Twisting Stock |
| ½" spacing, test material adjacent the magnet | 79.0 | 8.7 | 75.8 | 75.8 | 79.0 |
| 2¼" spacing, test material adjacent the magnet | 5.3 | 0.9 | 4.9 | 4.8 | 5.3 |
| 1½" spacing, test material adjacent the magnet | 12 | 1.0 | 11 | 11 | 12 |
| 1½" spacing, test material adjacent the probe | 12 | −1.0 | 11 | 4 | 12 |
| ½" spacing, test material adjacent the magnet | 71.0 | 4.9 | 68.6 | 67.6 | 71.0 |

From the above results, it will be seen that the magnetic barrier paper according to the present invention can confine magnetic fields to an extent about the same as 0.0005" thick tin plated iron foil.

The hand sheet according to sample 3 of the present invention was then tested for its rate of static decay. It will be appreciated that static decay rate is a measure of the electrical conductivity of the paper. The sample was conditioned at 73° F. and 50% relative humidity for four days. Then, voltages of +5,000 volts and −5,000 volts were applied to each side of the hand sheet according to Example 3. The results of those tests are set forth below in Table 3. In that table, the term "50% cut-off" refers to the point in time where the charge present on the paper had dissipated to 50% of that applied. Static decay rates were determined using an ETS static decay meter Model SDM 406B, manufactured by Electro-Tech Systems, Inc., Glenside, Pennsylvania. The times for the applied charge to decay to 50, 10 and 0% of its original value were measured. The sample size was 3½" by 5". It was observed that the sample readily accepted the charge, and that the decay rate followed an exponential curve.

TABLE 3

| | | Decay Rate | |
|---|---|---|---|
| Sample | Percent Cutoff | +5kv | −5kv |
| Side 1 | 50 | 0.02 | 0.03 |
| | 10 | 0.08 | 0.08 |
| | 0 | 0.14 | 0.14 |
| Side 2 | 50 | 0.02 | 0.02 |
| | 10 | 0.06 | 0.06 |
| | 0 | 0.12 | 0.14 |

The above data indicate that magnetic barrier paper according to the present invention has excellent static decay characteristics, evidencing very low resistance.

Although the present invention has been described in connection with various preferred embodiments thereof, it will be understood that these embodiments are solely for the purpose of illustration, and are not intended to limit the present invention in any way. Various modifications remain possible, especially from the point of view of substitution of equivalent materials and techniques, without departing whatsoever from the spirit and scope of the appended claims.

What is claimed is:

1. Magnetic barrier paper, comprising
   30-94% by weight low hysteresis iron powder having a hysteresis value of not more than about 5 parts per thousand,
   3-67% by weight pulp fibers, and
   3-10% latex effective to bind said pulp and powder.

2. Magnetic barrier paper according to claim 1, wherein said iron powder has a hysteresis value of less than about 1 part per thousand.

3. Magnetic barrier paper according to claim 1, wherein said iron powder has an average particle size ranging from about 2 to about 9 microns.

4. Magnetic barrier paper according to claim 3, wherein said iron powder has an average particle size ranging from about 2 to about 6 microns.

5. Magnetic barrier paper according to claim 3, wherein said iron powder is substantially devoid of particles having a size less than about 2 microns.

6. Magnetic barrier paper according to claim 1, wherein said iron powder is present in a weight percent of about 90, said latex is present in a weight percent of about 5.5, and said pulp is present in a weight percent of about 4.5.

7. A process for protecting an electronic component from a magnetic field which comprises substantially enclosing the electronic component in the magnetic barrier paper of claim 1.

8. The process of claim 7, wherein the electronic component is a floppy disk.

9. An article for protecting an electronic component from a magnetic field comprising an enclosure suitable for substantially enclosing the electronic component, which enclosure is comprised of the magnetic barrier paper of claim 1 such that the magnetic barrier paper substantially envelopes the electronic component when the electronic component is placed within the enclosure.

* * * * *